(12) United States Patent
Kim

(10) Patent No.: US 6,815,288 B2
(45) Date of Patent: Nov. 9, 2004

(54) MERGED MEMORY AND LOGIC SEMICONDUCTOR DEVICE OF SALICIDED DUAL GATE STRUCTURE INCLUDING EMBEDDED MEMORY OF SELF-ALIGNED CONTACT STRUCTURE AND MANUFACTURING METHOD THEREOF

(75) Inventor: Bong-seok Kim, Seongnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/623,587

(22) Filed: Jul. 22, 2003

(65) Prior Publication Data

US 2004/0126960 A1 Jul. 1, 2004

Related U.S. Application Data

(62) Division of application No. 09/850,143, filed on May 8, 2001, now Pat. No. 6,624,019.

(30) Foreign Application Priority Data

May 30, 2000 (KR) .......................................... 2000-29302

(51) Int. Cl.[7] .......................................... H01L 21/8242
(52) U.S. Cl. ........................ 438/241; 257/326; 257/369
(58) Field of Search ................................. 438/241, 258, 438/682; 257/326, 369

(56) References Cited

U.S. PATENT DOCUMENTS

| | | |
|---|---|---|
| 5,863,820 A | 1/1999 | Huang |
| 5,998,252 A | 12/1999 | Huang |
| 6,015,730 A | 1/2000 | Wang et al. |
| 6,096,595 A | 8/2000 | Huang |
| 6,168,984 B1 | 1/2001 | Yoo et al. |
| 6,218,715 B1 | 4/2001 | Kim et al. |
| 6,391,704 B1 | 5/2002 | Hong et al. |
| 6,432,768 B1 | 8/2002 | Chien et al. |
| 2003/0077859 A1 * | 4/2003 | Jeong .......................... 438/241 |
| 2003/0148572 A1 * | 8/2003 | Inaba .......................... 438/200 |

* cited by examiner

Primary Examiner—Long Pham
(74) Attorney, Agent, or Firm—Lee & Sterba, P.C.

(57) ABSTRACT

A memory merged logic (MML) semiconductor device of NMOS and PMOS dual gate structure including embedded memory of a self-aligned structure and a method of manufacturing the same, wherein in the MML semiconductor device, the memory area including n-type metal oxide semiconductor (NMOS) and p-type metal oxide semiconductor (PMOS) are integrated together, wherein the memory area includes a polycide gate electrode, a hard mask pattern comprised of nitride materials which is formed on the polycide gate electrode, a spacer comprised of nitride materials formed along the sidewall of the polycide gate electrode, and a self-aligned contact which is formed between the adjacent spacers and electrically connected with an impurity implantation region formed on a semiconductor substrate. The logic area includes salicided NMOS and PMOS gate electrodes and salicided source/drain regions, and the height of the polycide gate electrode is smaller than the height of the NMOS and PMOS gate electrodes.

11 Claims, 7 Drawing Sheets

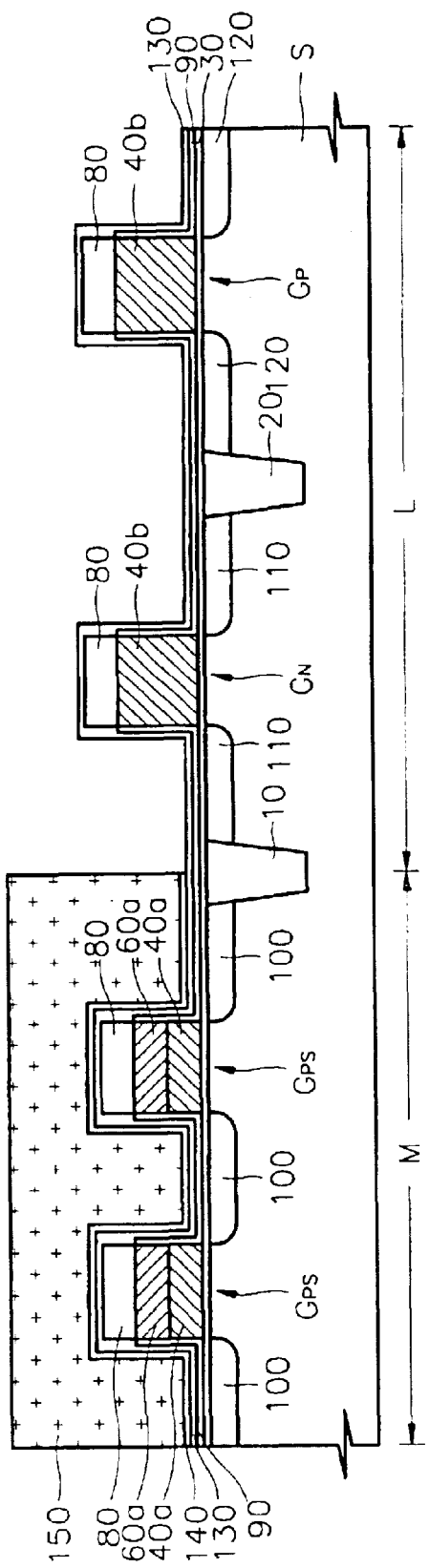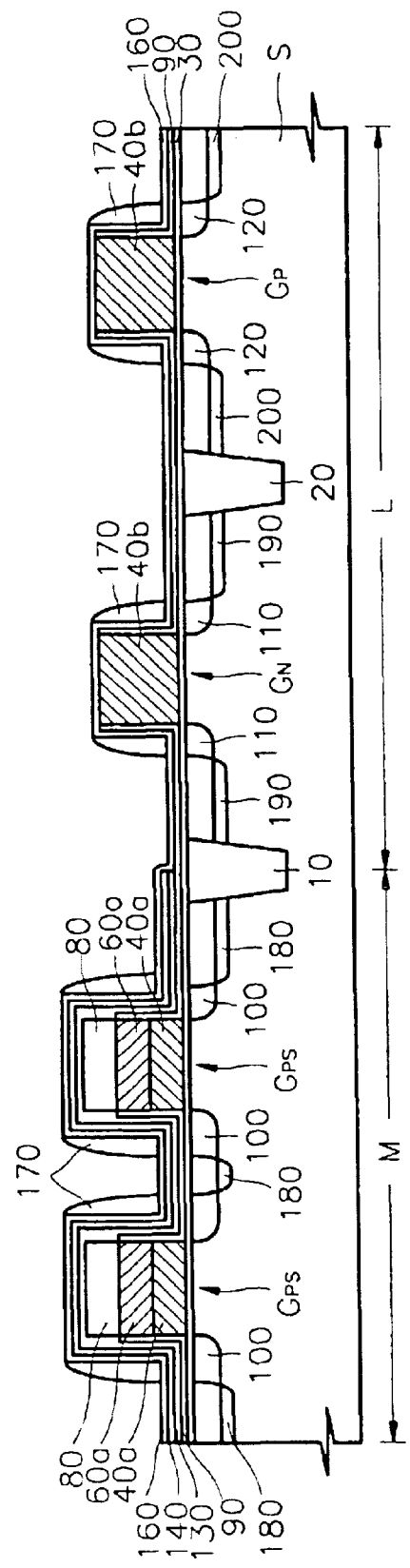

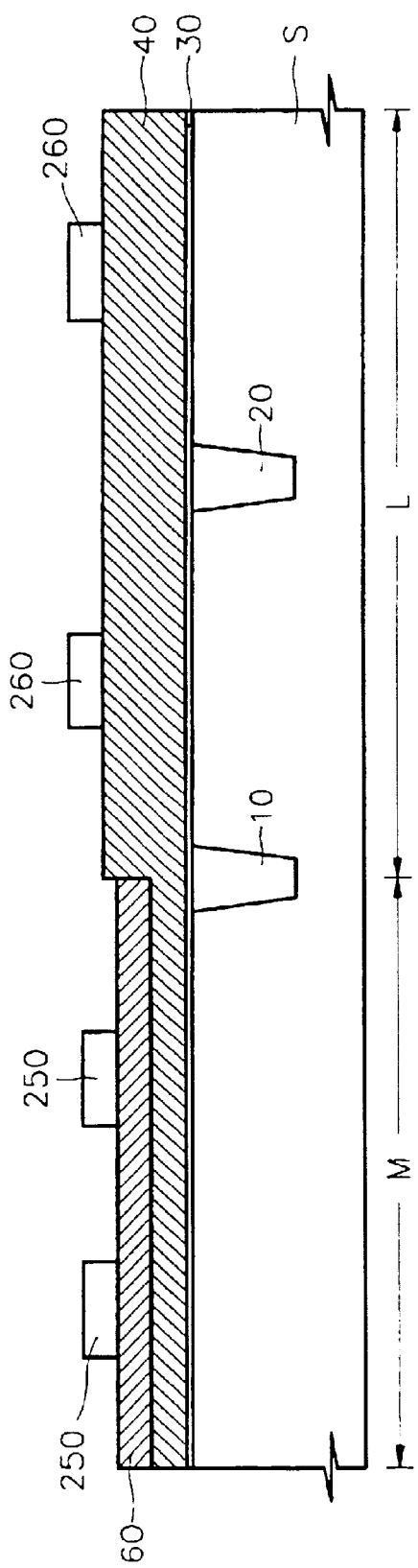
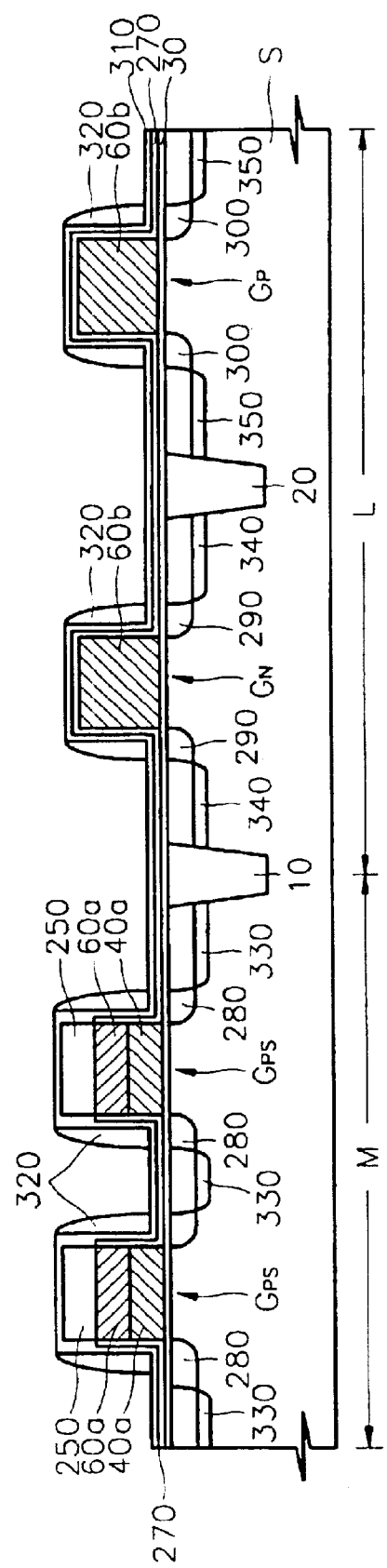

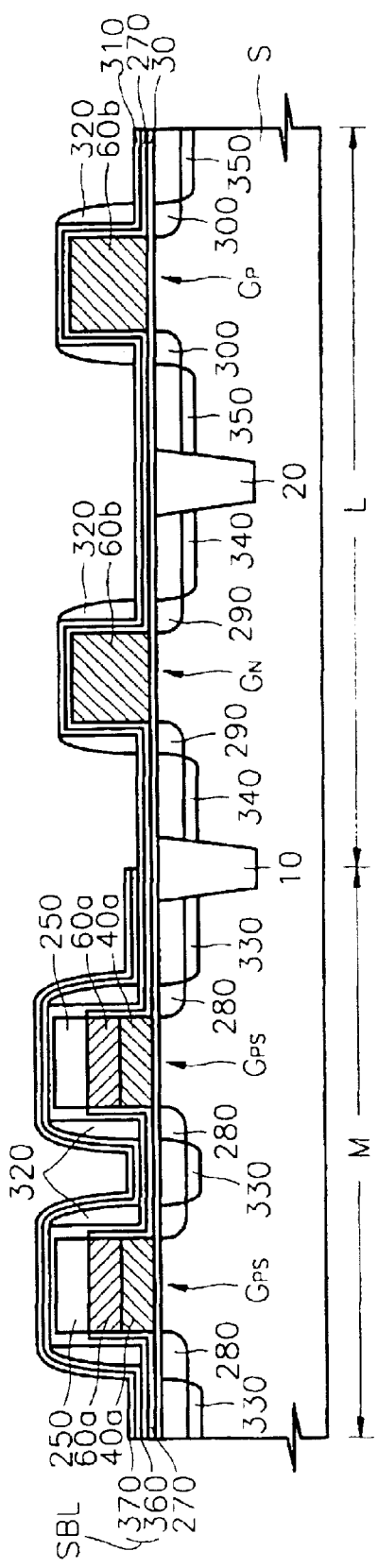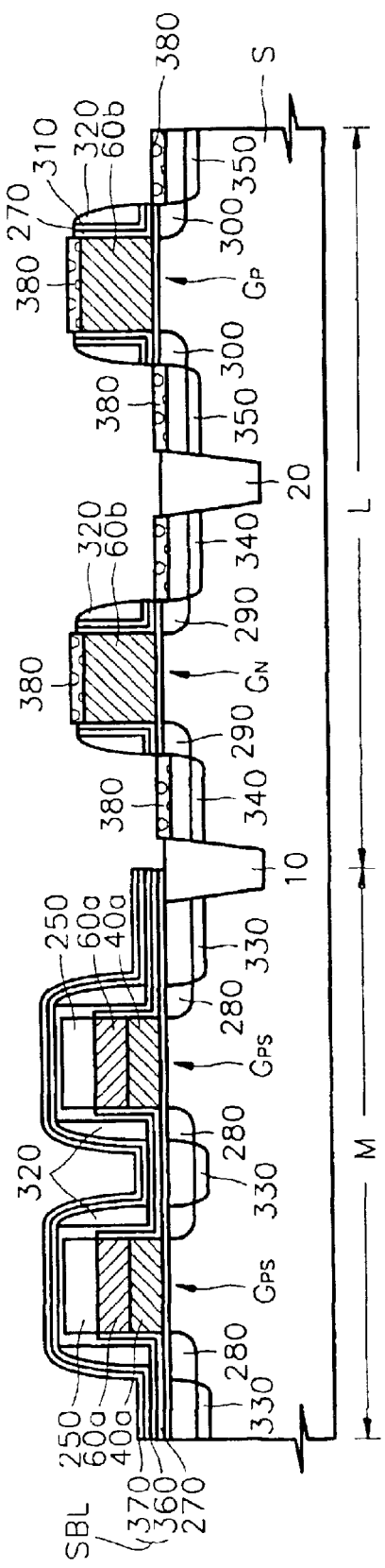

MERGED MEMORY AND LOGIC SEMICONDUCTOR DEVICE OF SALICIDED DUAL GATE STRUCTURE INCLUDING EMBEDDED MEMORY OF SELF-ALIGNED CONTACT STRUCTURE AND MANUFACTURING METHOD THEREOF

This application is a division of Ser. No. 09/850,143 filed May 8, 2001 now U.S. Pat. No. 6,624,019.

BACKGROUND OF THE INVENTION

1. Field of the Invention

The present invention relates to a semiconductor memory device and manufacturing method thereof. More particularly, the present invention relates to a memory merged logic (MML) semiconductor device having logic areas of a salicided dual gate structure and memory areas of a self-aligned contact (SAC) structure.

2. Description of the Related Art

With a recent trend toward high integration of semiconductor devices, miniaturization of various material layer patterns formed within a semiconductor device, increases of wafer diameters, and with a consumer's demand for various products, System on Chip is in high demand in the semiconductor industry. Due to the increasing demand for System on Chip, merged semiconductor devices such as MML semiconductor devices in which a memory circuit and a logic circuit have been integrated together onto a single chip have been proposed.

In the fabrication of the MML semiconductor devices, high integration density of the memory circuits and high performance (high operational speed, for example) of the logic circuits are pressing requirements. To satisfy these requirements, many attempts at manufacturing an MML semiconductor device of a dual gate structure have been recently made by combining a self-aligned contact process adopted for improving the integration density of a memory device in the semiconductor memory device manufacturing field, and a self-aligned silicide (SALICIDE) process adopted for improving device characteristics, such as the operational speed of logic devices in logic device manufacturing field. For example, U.S. Pat. Nos. 5,998,252 and 6,015,730 disclose methods of manufacturing MML semiconductor devices through combination of SAC and SALICIDE processes.

However, according to U.S. Pat. No. 5,998,252 entitled, "Method of Salicide and SAC (Self-Aligned Contact) Integration," and U.S. Pat. No. 6,015,730 entitled, "Integration of SAC and Salicide Processes by Combining Hard Mask and Poly Definition," gate electrodes formed on the memory and logic areas are patterned by different etching processes, and the thickness of each are the same. Thus, since a gate electrode patterning process is performed separately in the memory area and in the logic area, this causes complications in a process. Furthermore, if the thickness of the gate electrode is the same in the logic and memory areas, there is a limitation to adopting the SAC process in the memory area as the integration density of the MML semiconductor device increases. This limitation is because an increase in the integration density of the MML semiconductor device reduces the distance between the gate electrodes formed on the memory area to below a given limit. In this case, due to degradation of a step coverage characteristic, a void may occur within a contact hole when the contact hole formed as a result of the SAC process is filled with a conductive material.

SUMMARY OF THE INVENTION

To solve the above problems, it is a feature of an embodiment of the present invention to provide a memory merged logic (MML) semiconductor device including a self-aligned contact (SAC) and a polycide gate electrode on a memory area, and salicided NMOS and PMOS gate electrodes and salicided source/drain region on logic area, wherein the height of the polycide gate electrode on the memory area is smaller than the heights of the salicided NMOS and PMOS gate electrodes on the logic area.

It is another feature of an embodiment of the present invention to provide a method of manufacturing the MML semiconductor device capable of improving the device integration density in a memory area by making the gate electrode on the memory area lower than that on a logic area while patterning the gate electrodes on the logic and memory areas at the same time.

It is still another feature of an embodiment of the present invention to provide a method of manufacturing the MML semiconductor device by which a self-aligned contact (SAC) process on a memory area and self-aligned silicide (SALICIDE) and dual gate processes on a logic area can be performed.

According to an embodiment of the present invention, there is provided an MML semiconductor device in which a memory area of a self-aligned contact structure and a logic area of a dual gate structure including n-type metal oxide semiconductor (NMOS) and p-type metal oxide semiconductor (PMOS) are integrated together. The memory area includes a polycide gate electrode, a hard mask pattern comprised of nitride materials which is formed on the polycide gate electrode, a spacer comprised of nitride materials formed along the sidewall of the polycide gate electrode, and a self-aligned contact which is formed between the adjacent spacers and electrically connected with an impurity implantation region formed on a semiconductor substrate. The logic area includes salicided NMOS and PMOS gate electrodes and salicided source/drain regions, and the height of the polycide gate electrode is smaller than the height of the NMOS and PMOS gate electrodes.

Preferably, the polycide gate electrode includes a gate conductive pattern that is comprised of silicon and doped with conductive type impurities, and a silicide pattern. The gate conductive pattern may be a polysilicon pattern, and the silicide pattern may be a tungsten silicide pattern.

The NMOS gate electrode includes a gate conductive pattern that is comprised of silicon and doped with n-type impurities, and a silicide pattern formed by a self-aligned silicide (SALICIDE) process. The gate conductive pattern may be a polysilicon pattern, and the silicide pattern may be a cobalt silicide pattern.

Preferably, the PMOS gate electrode includes a gate conductive pattern that is comprised of silicon and doped with p-type impurities, and a silicide pattern formed by a SALICIDE process. The gate conductive pattern may be a polysilicon pattern, and the silicide pattern may be a cobalt silicide pattern.

The polycide gate electrode and the salicided NMOS and PMOS gate electrodes may include different kinds of silicide patterns.

A gate poly oxide layer is interposed between the sidewall of the polycide gate electrode and the spacer. The gate poly oxide layer, a nitride layer, and a medium temperature oxide (MTO) layer may be sequentially interposed in a direction from the sidewall of the polycide gate electrode to the spacer. The gate poly oxide layer and the medium temperature oxide layer may be sequentially interposed in a direction from the sidewall of the polycide gate electrode to the spacer.

An embodiment of the present invention also provides a method of manufacturing an MML semiconductor device including the following steps. First, (a) a semiconductor substrate on which a memory area and a logic area are defined, and on which an isolation layer and a gate oxide layer formed on an active region defined by the isolation layer have been formed is prepared. Second, (b) a gate conductive layer comprised of silicon is formed on the memory area and the logic area. Third, (c) the height of the gate conductive layer formed on the memory area is lowered and a predetermined conductive type of impurities is implanted into the lowered gate conductive layer. Fourth, (d) a silicide layer is formed only on the lowered gate conductive layer on the memory area using deposition and photolithography. In this case, the top surface of the silicide layer is lower than the top surface of the gate conductive layer formed on the logic area.

The third step, (c), additionally includes the following steps. First, (c1) a photoresist pattern is formed on the logic area. Second, (c2) the gate conductive layer formed on the memory area is etched by an etching process that uses the photoresist pattern as an etch mask and the gate conductive layer on the memory area is made lower than the gate conductive layer on the logic area. Third, (c3) an ion implantation process is performed to implant a predetermined conductive type of impurities into the lowered gate conductive layer on the memory area.

The fourth step, (d), additionally includes the following steps. First, (d1) a silicide layer is formed on the memory area and the logic area. Second, (d2) a photoresist pattern is formed on the silicide layer formed on the memory area. Third, (d3) the silicide layer formed on the logic area is removed using the photoresist pattern as an etch mask. Fourth, (d4) the photoresist pattern is removed.

The manufacturing method may additionally include the following steps after the fourth step, (d). Fifth, (e1) hard mask patterns comprised of nitride are formed on portions in which the gate electrodes will be formed on the memory area and the logic area. Sixth, (f1) the polycide gate electrode doped with predetermined impurities and the NMOS and PMOS gate electrodes not doped with impurities are formed on the memory area and the logic area, respectively. Seventh, (g1) lightly doped drain (LDD) structures having a conductive type of impurities required in the memory and logic areas are implemented by an ion implantation process. Eighth, (h1) a nitride layer and an oxide layer are sequentially formed over the entire surface of the semiconductor substrate in which the LDD structures have been implemented. Continuously, in the ninth step, (i1) the oxide layer formed only on the logic area is selectively removed. Tenth, (j1) a nitride layer formed on the logic area and a hard mask pattern formed on the NMOS and PMOS gate electrodes are removed by a wet etching process. The gate oxide layer is used as an etch stop layer in forming the polycide gate electrode and the NMOS and PMOS gate electrodes in the step (f1).

The manufacturing method may further still include the following steps. Eleventh, (k1), a spacer comprised of nitride is formed along the sidewall of the polycide gate electrode and the NMOS and PMOS gate electrodes. Twelfth, (l1), a predetermined conductive type of impurities is implanted into the memory area and the logic area to form source/drain regions, and at the same time a predetermined conductive type of impurities are implanted into the NMOS and PMOS gate electrodes. Thirteenth, (m1), the top surface of the NMOS and PMOS gate electrodes and the source/drain region formed on the logic area are exposed. Fourteenth, (n1), a silicide pattern is formed on the top surface of the NMOS and PMOS gate electrodes and the source/drain region on the logic area by a self-aligned silicide (SALICIDE) process. Continuously, in the fifteenth step, (o1) an interlayer dielectric is formed over the entire surface of the semiconductor substrate. Sixteenth, (p1) a self-aligned contact (SAC) electrically connected with the source/drain region formed on the memory area is formed by a SAC process.

Prior to the thirteenth step (m1), a silicide blocking layer, in which a medium temperature oxide layer and a nitride layer are sequentially stacked, may be selectively formed only on the memory area.

The manufacturing method may additionally include the alternative steps following the step (d). Fifth, (e2) a hard mask pattern comprised of nitride and a photoresist pattern is formed on portions in which the gate electrodes will be formed on the memory area and the logic area, respectively. Sixth, (f2) a polycide gate electrode doped with predetermined impurities and NMOS and PMOS gate electrodes not doped with impurities are formed on the memory are and logic area, respectively, by an etching process that uses the hard mask pattern and the photoresist pattern as an etch mask.

Preferably, the gate oxide layer is used as an etch stop layer in forming the polycide gate electrode and NMOS and PMOS gate electrodes in the alternate sixth step (f2).

The manufacturing method may additionally include the following alternate steps after the alternate sixth step (f2). Seventh, (g2) the photoresist pattern is removed. Eighth, (h2) the LDD structures having a conductive type required in the memory area and the logic area are implemented by an ion implantation process. Ninth, (i2) a spacer comprised of nitride on the sidewall of the polycide gate electrode and the NMOS and PMOS gate electrodes is formed. Tenth, (j2) source/drain regions are formed on the memory area and the logic area by an ion implantation process. Continuously, in the alternate eleventh step, (k2) a silicide blocking layer, in which a medium temperature oxide layer and a nitride layer are sequentially stacked, is selectively formed only on the memory area. Twelfth, (l2) the top surface of the NMOS and PMOS gate electrodes and the source/drain regions of the NMOS and PMOS are exposed, while protecting the memory area by the silicide blocking layer. Then, in the alternate thirteenth step, (m2) a SALICIDE process is performed to form a silicide pattern on the top surface of the NMOS and PMOS gate electrodes and the source/drain regions of the NMOS and PMOS. Fourteenth, (n2) an interlayer dielectric is formed over the entire surface of the semiconductor substrate. Fifteenth (o2), a SAC electrically connected with the source/drain region formed on the memory area is formed by a SAC process.

These and other features of the embodiments of the present invention will be readily apparent to those of ordinary skill in the art upon review of the detailed description that follows.

BRIEF DESCRIPTION OF THE DRAWINGS

The above features and advantages of the embodiments of the present invention will become more apparent by describing in detail a preferred embodiment thereof with reference to the attached drawings in which:

FIGS. 1A–1H are cross-sectional views illustrating a process of manufacturing a memory merged logic (MML) semiconductor device according to a first embodiment of the present invention; and FIGS. 2A–2E are cross-sectional views illustrating a process of manufacturing an MML semiconductor device according to a second embodiment of the present invention.

DETAILED DESCRIPTION OF THE PREFERRED EMBODIMENTS

Figure 1A:
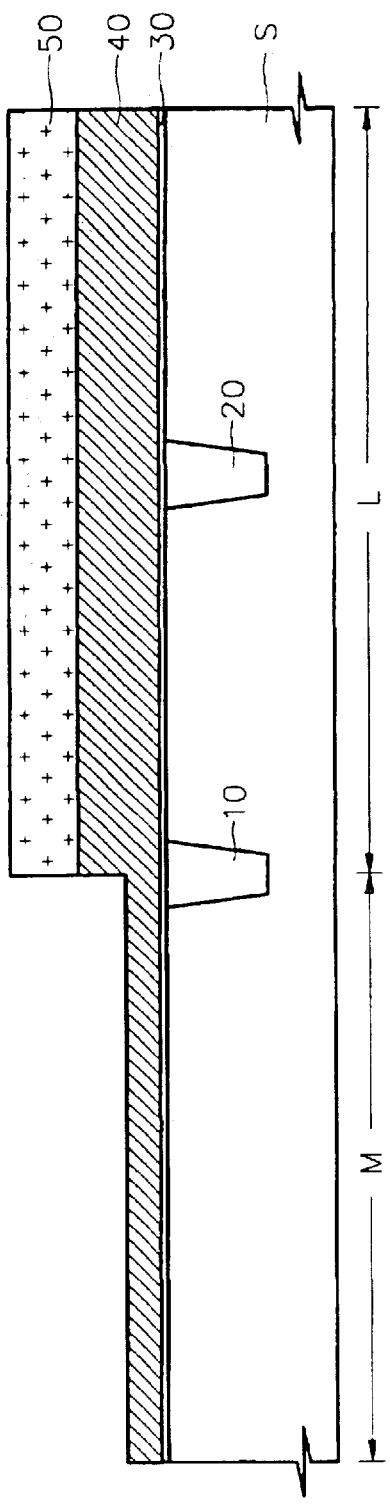

Korean Patent Application No. 00-29302, filed on May 30, 2000, and entitled: "Merged Memory and Logic Semiconductor Device of Salicided Dual Gate Structure Including Embedded Memory of Self-aligned Contact Structure and Manufacturing Method Thereof," is incorporated by reference herein in its entirety.

The present invention will now be described more fully with reference to the accompanying drawings, in which preferred embodiments of the present invention are illustrated. The present invention may, however, be embodied in many different forms and should not be construed as being limited to the embodiments set forth herein. Rather, these embodiments are provided so that this disclosure will be thorough and complete, and will fully convey the concept of the present invention to those of ordinary skill in the art. In the drawings, the shape of elements is exaggerated for clarity, and the same reference numerals in different drawings represent the same element. Further, it will be understood that when a layer is referred to as being "on" another layer or substrate, it can be directly on the other layer or substrate, or intervening layers may also be present. Meanwhile, in describing a memory merged logic (MML) semiconductor device and manufacturing method thereof according to the preferred embodiments of the invention, memory and logic areas are denoted by characters M and L, respectively.

Referring to FIG. 1A, initially, first and second isolation layers 10 and 20 are formed on a semiconductor substrate S in which a memory area M and a logic area L are defined. The first isolation layer 10 defines the boundary between the memory area M and the logic area L, while the second isolation layer 20 fixes the boundary between regions in which an NMOS transistor and a PMOS transistor will be formed. The first and second isolation layers 10 and 20 are formed of silicon oxide using conventional isolation methods such as a trench isolation technique. Then, a gate oxide layer 30 is formed over the exposed semiconductor substrate S on the memory area M and the logic area L, using conventional techniques such as thermal oxidation. Although not shown, if the gate oxide layer 30 is formed using a dual gate oxide layer process which is widely known in the art, the thickness of the gate oxide layer 30 may vary on the memory area M and the logic area L. For example, the gate oxide layer 30 formed on the memory area M may be thicker than that formed on the logic area L. Next, a gate conductive layer 40 comprised of polysilicon is formed to a thickness of about 1,000–5,000 Å using conventional techniques such as chemical vapor deposition (CVD).

Then, photolithography is performed to form a photoresist pattern 50 on the logic area L. Using the photoresist pattern 50 as an etch mask, the gate conductive layer 40 formed on the memory area M is etched, thereby making the top surface of the gate conductive layer 40 on the memory area M become lower than that of the gate conductive layer 40 on the logic area L. The gate conductive layer 40 on the memory area is etched by a thickness of 500–4,000 Å using a dry etching method having a good anisotropic etching characteristic such as reactive ion etching (RIE). Subsequently, an ion implantation process is performed to implant conductive type impurities such as n-type impurities into only the gate conductive layer 40 formed on the memory area M.

Figure 1B:
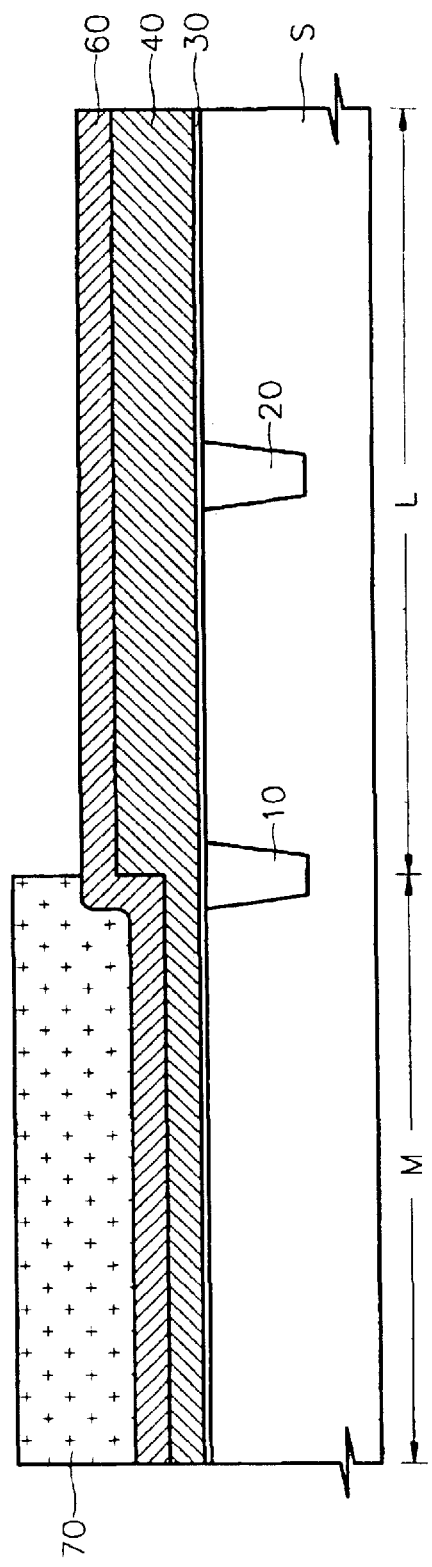

Referring to FIG. 1B, after removing the photoresist pattern (50 of FIG. 1A) formed on the logic area L, a silicide layer 60 preferably comprised of $WSi_x$ is formed over the entire surface of the semiconductor substrate S. The silicide layer 60 may be formed of silicide materials other than $WSi_x$. The silicide layer 60 is deposited to a thickness of about 300–2,000 Å using conventional deposition techniques such as CVD. Thus, the top surface of the silicide layer 60 formed on the memory area M is lower than that of the gate conductive layer 40 formed on the logic area L, and this has a desirable effect. The specific reason for this will be described later. Next, photolithography is performed to form a photoresist pattern 70 on the memory area M, thereby selectively exposing the silicide layer 60 formed on the logic area L.

Figure 1C:
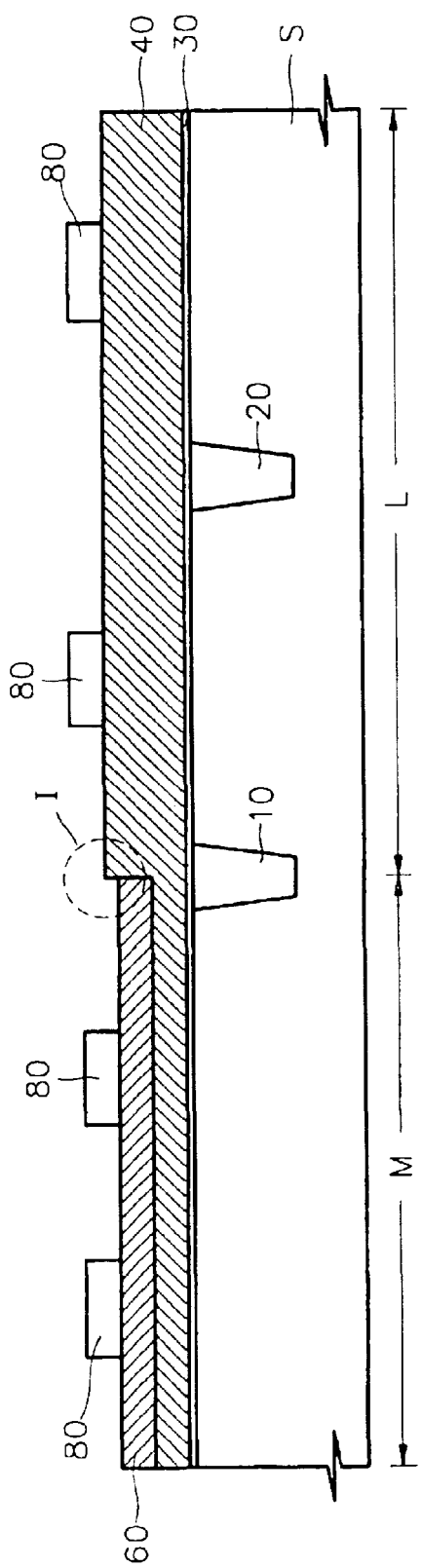

Referring to FIG. 1C, using the photoresist pattern (70 of FIG. 1B) as an etch mask, the silicide layer 60 exposed on the logic area L is removed by dry etching having an anisotropic etching characteristic such as RIE. Then, a hard mask layer is deposited over the memory area M and the logic area L by conventional deposition techniques such as CVD, and then patterned by photolithography and etch process to form a hard mask pattern 80. The hard mask pattern 80 is used as an etch mask for a subsequent gate electrode patterning process which will be performed on the memory area M and the logic area L at the same time. Since it is desirable that the hard mask pattern 80 is formed of a material having high etching selectivity with respect to a material of the gate conductive layer 40, the hard mask pattern 80 is formed of a nitride-based insulating material such as silicon nitride. When necessary, the hard mask pattern 80 may be formed of silicon oxynitride. Location I indicates a step difference between the memory area M and the logic area L.

Figure 1D:
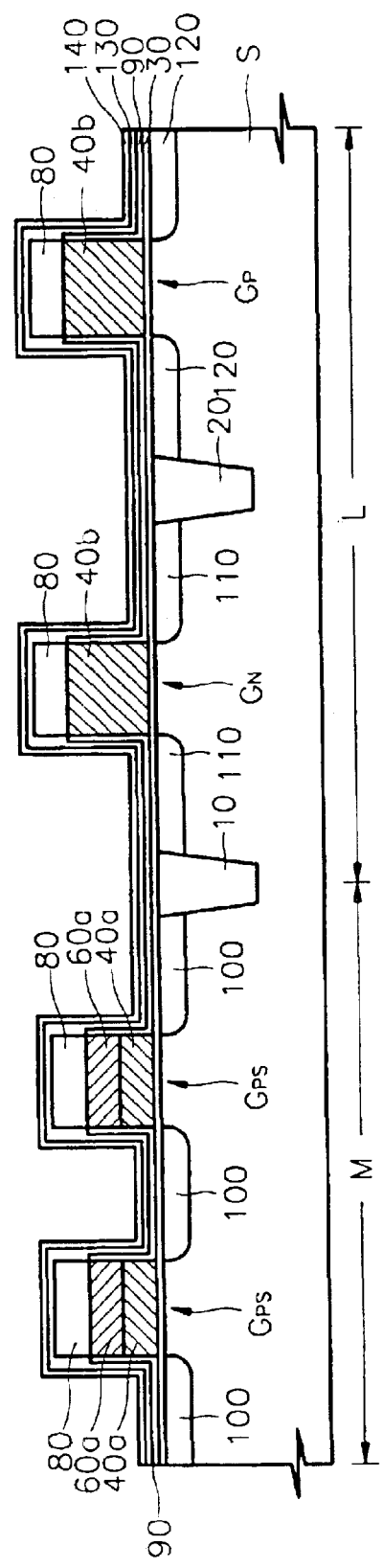

Referring to FIG. 1D, using the hard mask pattern 80 as an etch mask, dry etching having an anisotropic etching characteristic such as RIE is performed to form a polycide electrode $G_{PS}$ on the memory area M and NMOS and PMOS gate electrodes $G_N$ and $G_P$ on the logic area L. Thus, in an etching process for patterning the polycide electrode $G_{PS}$ and the NMOS and PMOS gate electrodes $G_N$ and $G_P$, an etch stop point is preferably on the gate oxide layer 30. Thus, the dry etching process for forming the polycide electrode $G_{PS}$ and the NMOS and PMOS gate electrodes $G_N$ and $G_P$ is performed in such a way as to maintain high selectivity between the gate conductive layer 40 and the gate oxide layer 30, and also between the silicide layer 60 and the gate oxide layer 30. The polycide gate electrode $G_{PS}$ has a multi-layered structure in which a gate conductive pattern 40a doped with conductive type impurities such as n-type impurities, and a silicide pattern 60a are sequentially stacked, while the NMOS and PMOS gate electrodes $G_N$ and $G_P$ have a single layered structure comprised of only a gate conductive pattern 40b which is not doped with impurities.

When the polycide electrode $G_{PS}$ and the NMOS and PMOS gate electrodes $G_N$ and $G_P$ are formed by the RIE process, process conditions are controlled so that etch rates on the memory area M and the logic area L may be substantially identical. More specifically, when the silicide layer 60 on the memory area M is etched to expose the top surface of the underlying gate conductive layer 40 on the same area the process conditions are controlled so that the etched surface of the gate conductive layer 40 on the logic area L may be substantially as high as the top surface of the gate conductive layer 40 formed on the memory area M. In this respect, in a method of manufacturing an MML semiconductor device according to an embodiment of the invention, there is a step difference (l of FIG. 1C) between the memory area M and the logic area L. This is related to etching selectivity between the silicide layer 60 comprised of tungsten silicide, and the gate conductive layer 40 comprised of polysilicon. In other words, the etching process for patterning the gate electrodes $G_{PS}$, $G_N$ and $G_P$ may utilize HBr gas and $CCl_4$ gas as an etching reactive gas, in which case polysilicon is likely to be removed more quickly than tungsten silicide. Thus, if there is a step difference (l of FIG. 1C) between the memory area M and the logic area L, etch rates on the memory area M and the logic area L are made substantially equal to pattern the gate electrodes $G_{PS}$, $G_N$ and $G_P$ at the same time. The step difference (l of FIG. 1C) between the memory area L and the logic area L may vary depending on types of etching reactive gas used for etching, and a silicide material forming the suicide layer 60. This difference may be easily determined by one of ordinary skill in this art.

Subsequently, to recover damage on the sidewalls of the gate electrodes $G_{PS}$, $G_N$ and $G_P$ during a process of forming the gate electrodes $G_{PS}$, $G_N$ and $G_P$, a heat treatment process is performed in an oxygen atmosphere (hereinafter called "Gate Poly Oxide (GPOX) process"). The heat treatment process is performed at a temperature of about 800° C., suitable for recovering the damage on the sidewalls of the polycide electrode $G_{PS}$, and on the sidewalls of the NMOS and PMOS gate electrodes $G_N$ and $G_P$. The GPOX process is performed to form a GPOX layer 90 which is an oxide layer formed by the GPOX process. The GPOX layer 90 having an infinitesimal thickness is formed on the exposed hard mask pattern 80, but actually it may not be deemed to be formed.

Continuously, low density conductive type impurities are implanted into the memory area M and/or the logic area L by an ion implantation process to implement lightly doped drain (LDD) structures 100, 110, and 120. Preferably, first, an N-LDD structure 100 is implemented on the memory area M, and then N- and P-LDD structures 110 and 120 are implemented on the logic area L. However, the conductive type and formation sequence in the LDD structures 100, 110, and 120 implemented on the memory area M and the logic area L will not be restricted to the above, and they may vary depending on the conductivity type of a semiconductor device integrated on the memory area M and the logic area L, and for convenience of a process for implementing the LDD structures 100, 110, and 120.

Following implementation of the LDD structures 100, 110, and 120 on the memory area M and the logic area L as described above, a nitride layer 130 and a medium temperature oxide (MTO) layer 140 are sequentially provided over the entire surface of the semiconductor substrate S. Here, the MTO layer 140 refers to an oxide layer formed at a temperature of 300–600° C. A high temperature oxide (HTO) layer may be formed instead of the MTO layer 140. The nitride layer 130 and the MTO layer 140 are deposited to a thickness of about 50–150 Å and about 100–200 Å, respectively, by conventional techniques such as CVD.

Referring to FIG. 1E, after forming a photoresist pattern 150 on the memory area M by a photolithography process, the photoresist pattern 150 is used as an etch mask, the MTO layer 140 exposed on the logic area L is removed using conventional techniques such as wet etching. In etching the MTO layer 140 by wet etching, a conventional wet etchant, such as a fluoric acid solution or a buffered oxide etchant (BOE) solution is used.

Referring to FIG. 1F, following removal of the photoresist pattern 150, using the MTO layer 140 formed on the memory area M as an etch mask, the nitride layer (130 of FIG. 1E) exposed on the logic area L and the hard mask pattern (80 of FIG. 1E) overlying the NMOS and PMOS gate electrodes $G_N$ and $G_P$ are removed using a conventional wet etchant such as phosphoric acid. In this case, etching of the hard mask pattern 80 overlying the polycide gate electrode $G_{PS}$ on the memory area M is prevented by the MTO layer 140 which residues on the memory area M.

Next, the MTO layer 160 is formed over the entire surface of the semiconductor substrate S. In this case, a high temperature oxide (HTO) layer may be formed instead. Then, a spacer 170 comprised of a nitride layer is formed along the sidewall of the polycide gate electrode $G_{PS}$, and along the sidewalls of the NMOS and PMOS gate electrodes $G_N$ and $G_P$, using a conventional spacer formation method. Preferably, a nitride layer is formed over the entire surface of the semiconductor substrate S to a predetermined thickness. Next, the nitride layer which has been formed over the entire surface of the semiconductor substrate S is etched to form the spacer 170 using a dry etching method having an anisotropic etching characteristic that uses the MTO layer 160 as an etch stop layer, such as RIE or etchback. If the GPOX layer 90 on the logic area L is formed to a thickness sufficient to be used as an etch stop layer in an etching step for forming the spacer 170, the MTO layer 160 may not be formed over the entire surface of the semiconductor substrate S before proceeding with the step for forming the spacer 170.

Continuously, high density conductive type impurities are implanted into the memory area M and/or the logic area L by an ion implantation process using the spacer 170 as an ion mask to form source/drain regions 180, 190, and 200, while implanting high density conductive type impurities into the NMOS and PMOS gate electrodes $G_N$ and $G_P$. Preferably, first, an N+ source/drain region 180 is formed on the right and left sides of the polycide gate electrode $G_{PS}$ on the memory area M. Then, an N+ source/drain region 190 and a P+ source/drain region 200 are formed on the right and left sides of the NMOS and PMOS gate electrodes $G_N$ and $G_P$, respectively, while implanting N+ and P+ conductive type impurities into the NMOS and PMOS gate electrodes $G_N$ and $G_P$, respectively. In particular, in the step of implanting the P+ conductive type impurities into the PMOS gate electrode $G_P$ while forming the P+ source/drain region 200, boron (B) ions are mainly used as conductive type impurities. It is known that the B ions has a strong tendency to penetrate into a PMOS channel underlying the gate oxide layer 30 by thermal diffusion, compared with n type impurities such as phosphorus (P) ions or arsenic (As) ions. However, a method of manufacturing the MML semiconductor device according to the invention involves implantation of conductive type impurities into the PMOS gate electrode $G_P$ following a high temperature heat treatment such as the GPOX process, thereby alleviating the problem with thermal diffusion of B ions. In this case, the conductive type and formation sequence adopted in the source/drain regions 180, 190, and 200 formed on the memory area M and the logic area L will not be restricted to the above, and they may vary depending on types of a semiconductor device integrated on the memory area M and the logic area L, and for convenience of a process for implementing the source/drain regions 180, 190, and 200.

Figure 1G:
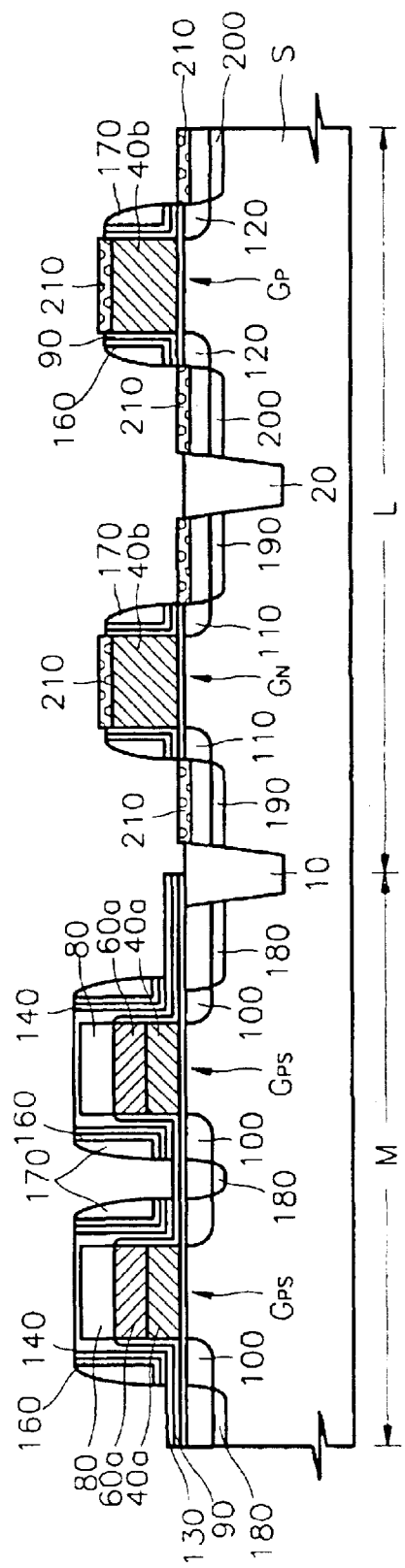

Referring to FIG. 1G, a wet etching process, which uses a hydrofluoric acid (HF) solution or BOE solution as an wet etchant for removing an oxide-based insulating material, is performed to expose the top surface of the NMOS and PMOS gate electrodes $G_N$ and $G_P$ and the source/drain regions 190 and 200 of NMOS and PMOS. Then, a self-aligned suicide (SALICIDE) process is performed to form a suicide pattern 210 such as a cobalt silicide pattern, which is self-aligned on the top surface of the NMOS and PMOS gate electrodes $G_N$ and $G_P$ of the logic area L, and the source/drain regions 190 and 200. Specifically, a high melting point metal layer such as a cobalt layer is formed over the entire surface of the semiconductor substrate S to a predetermined thickness. Then, to cause a silicidation reaction at interfaces between the cobalt layer and the NMOS and PMOS gate electrodes $G_N$ arid $G_P$, and between the cobalt layer and the source/drain regions 190 and 200, a heat treatment process is performed, followed by removal of an unsilcided high melting point metal layer.

Although not shown in the drawings, if necessary, before exposing the top surface of the NMOS and PMOS gate electrodes $G_N$ and $G_P$ and the source/drain regions 190 and 200 by a wet etching process, material layer deposition, photolithography, and etch process may be performed to form a silcidation blocking layer (SBL), in which an MTO layer and a nitride layer are sequentially stacked, only on the memory area M. In this case, an HTO layer may be used instead of the MTO layer.

Figure 1H:
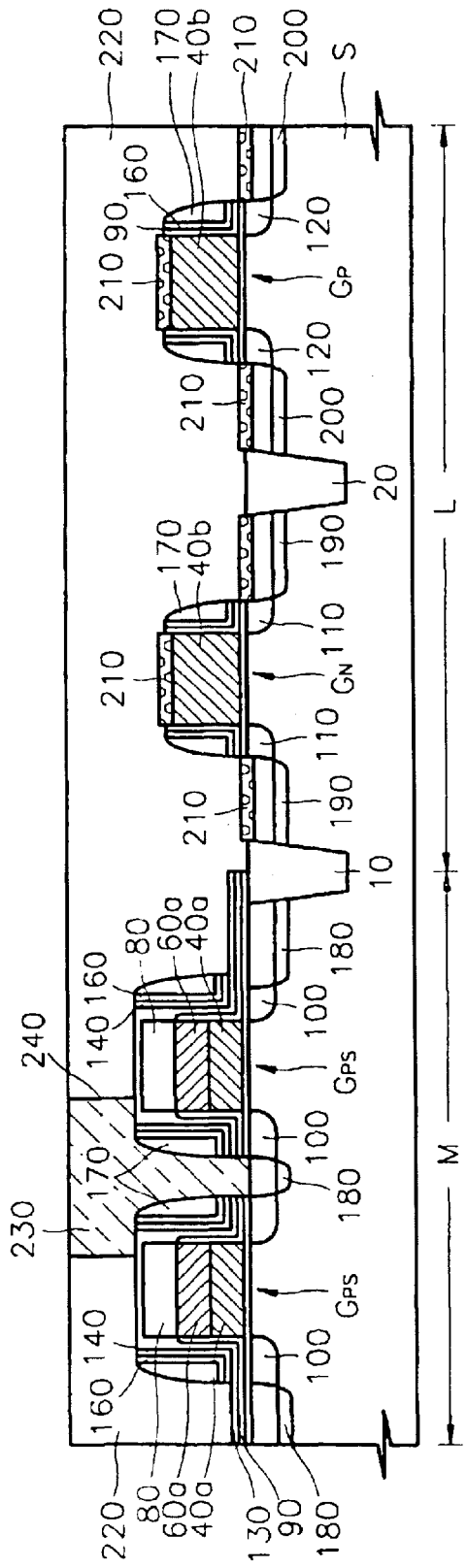

Referring to FIG. 1H, an interlayer dielectric 220 comprised of silicon oxide is formed over the entire surface of the semiconductor substrate S. Then, a self-aligned contact (SAC) process is performed on the memory area M to form a SAC 230 electrically connected with the source/drain region 180. Preferably, a photoresist pattern (not shown) that defines a portion for a contact hole 240 is formed on the interlayer dielectric 220. Then, a dry etching process that uses the photoresist pattern, and the hard mask pattern 80 and the spacer 170 formed on the memory area M as an etch mask is performed to form the contact hole 240 exposing the source/drain region 180 on which the SAC 230 will be formed. Then, after filling the contact hole 240 with a conductive material such as polysilicon by a conventional technique, global planarization is performed to form the SAC 230 within the contact hole 240.

Heretofore, a method of manufacturing the MML semiconductor device according to a first embodiment of the present invention has been described. The structure of an MML semiconductor device according to a first embodiment of the invention will now be described in detail with reference to FIG. 1H. Referring to FIG. 1H, a polycide gate electrode $G_{PS}$ in which a gate conductive pattern 40a and a silicide pattern 60a are sequentially stacked is formed on a memory area M, while salicided NMOS and PMOS gate electrodes $G_N$ and $G_P$ and salicided source/drain regions 190 and 200 are formed on a logic area L. The polycide gate electrode $G_{PS}$ is lower than the NMOS and PMOS gate electrodes $G_N$ and $G_P$.

A spacer 170 comprised of a nitride layer formed along the sidewall of the polycide gate electrode $G_{PS}$ and along the sidewall of the NMOS and PMOS gate electrodes $G_N$ and $G_P$. An MTO layer 140 or an HTO layer (not shown), and a nitride layer 130 are sequentially interposed between the sidewall of the polycide gate electrode $G_{PS}$, and the nitride spacer 170. A GPOX layer 90 may be interposed between the MTO layer 140 or the HTO layer, and the polycide gate electrode $G_{PS}$.

An interlayer dielectric 220, overlying the polycide gate electrode $G_{PS}$ and the NMOS and PMOS gate electrodes $G_N$ and $G_P$, is formed over the entire surface of a semiconductor substrate S. A SAC 230 formed by a SAC process is provided on a source/drain region 180 formed on the memory area 220 through the interlayer dielectric 220. An MTO layer 160 and an HTO layer (not shown) may be interposed between the interlayer dielectric 220 and a hard mask pattern 80 overlying the polycide gate electrode $G_{PS}$. Although not shown in FIG. 1H, a SBL, in which an MTO layer and a nitride layer are sequentially stacked, may be interposed between the MTO layer 160 or the HTO layer, and the interlayer dielectric 220.

The silicide pattern 60a contained in the polycide gate electrode $G_{PS}$, and a silicide pattern 210 overlying the NMOS and PMOS gate electrodes $G_N$ and $G_P$ may be comprised of different kinds of silicide materials.

FIGS. 2A–2E are cross-sectional views illustrating a manufacturing process of an MML semiconductor device according to a second embodiment of the present invention.

In the method of manufacturing the MML semiconductor device according to the invention according to the second embodiment of the invention, substantially the same steps are performed as in the first embodiment of the present invention up to the step of selectively forming the silicide layer (60 of FIG. 1C) of $WSi_x$ only on the memory area M.

Referring to FIG. 2A, a hard mask pattern 250 composed of a nitride material is formed on the silicide layer 60 on the memory area M, and a photoresist pattern 260 is formed on the gate conductive layer 40 on the logic area L. The hard mask pattern 250 may be formed using material layer deposition, photolithography, and etching process, and the photoresist pattern 260 may be formed using a photolithography process.

Referring to FIG. 2B, using the hard mask pattern 250 and the photoresist pattern 260 as an etch mask, a dry etching process such as RIE having an anisotropic etching characteristic is performed to form a polycide gate electrode $G_{PS}$ on the memory area M and NMOS and PMOS gate electrodes $G_N$ and $G_P$ on the logic area L. The technical idea applied in the step of forming the polycide gate electrode $G_{PS}$ and the NMOS and PMOS gate electrodes $G_N$ and $G_P$ is substantially the same as in the first embodiment of the present invention. The polycide gate electrode $G_{PS}$ is a multi-layered structure in which a gate conductive pattern 40a doped with conductive type impurities such as n-type impurities and a silicide pattern 60a are sequentially stacked, whereas the NMOS and PMOS gate electrodes $G_N$ and $G_P$ is of a single layered structure comprised of only a gate conductive pattern 60b which is in an undoped state.

Next, following removal of the photoresist pattern 260, as in the first embodiment of the invention, to recover damage to sidewalls of the gate electrodes during the step of forming the polycide gate electrode $G_{PS}$ and the NMOS and PMOS gate electrodes $G_N$ and $G_P$, a GPOX process is performed to form a GPOX layer 270. Then, an ion implantation process is performed to implement an N-LDD structure 280 on the memory area and N- and P-LDD structures 290 and 300 on the logic area. In this case, the applied technical idea is the same as in the first embodiment. Then, an MTO layer 310 is formed over the entire surface of the semiconductor substrate S. Of course, an HTO layer may be formed instead. A spacer 320 comprised of nitride materials is formed along the sidewall of the polycide gate electrode $G_{PS}$ and the NMOS and PMOS gate electrodes $G_N$ and $G_P$, using the substantially the same method as described in the step of forming the spacer (170 of FIG. 1F) in the first embodiment. Of course, as in the first embodiment of the invention, the step of forming the MTO layer 310 may be omitted. Subsequently, an ion implantation process during which high density conductive type impurities are implanted is performed to form an N+ source/drain region 330 on the memory area M and N+ and P+ source/drain regions 340 and 350 on the logic area L. In this case, the applied technical idea is the same as in the first embodiment.

Referring to FIG. 2C, material layer deposition, photolithography, and etching process are applied to form a silcidation blocking layer SBL, in which an MTO layer 360 and a nitride layer 370 are sequentially formed, only on the memory area M. Of course, an HTO layer may be formed instead of the MTO layer 360.

Referring to FIG. 2D, using the nitride layer 370 formed on the memory area M and the spacer 320 formed on the logic area L as an etch mask, a wet etching process that uses an HF or BOE solution as a wet etchant is performed to expose the source/drain regions 340 and 350 and the top surface of the NMOS and PMOS gate electrodes $G_N$ and $G_P$ on the logic area L. Then, as in the first embodiment, a SALICIDE process is performed to form a silicide pattern 380 such as a cobalt silicide pattern, which is self aligned on the source/drain regions 340 and 350 and the top surface of the NMOS and PMOS gate electrodes $G_N$ and $G_P$.

Figure 2E:
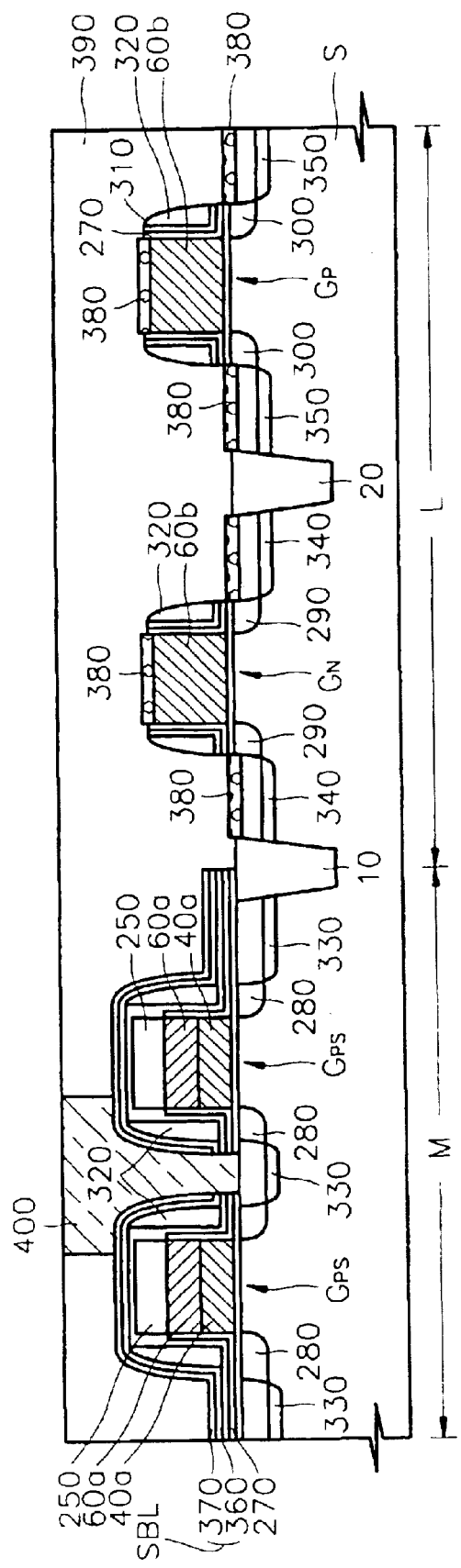

Referring to FIG. 2E, after forming an interlayer dielectric 390 comprised of silicon oxide over the entire surface of the semiconductor substrate S, as in the first embodiment, a SAC process is performed to a SAC 400 electrically connected with the source/drain region 330 on the memory area M.

Heretofore, the method of manufacturing the MML semiconductor device according to the second embodiment of the present invention has been described. The structure of an MML semiconductor device according to the second embodiment of the present invention will now be described with reference to FIG. 2E.

Referring to FIG. 2E, the polycide gate electrode $G_{PS}$, in which the gate conductive pattern 40a comprised of polysilicon and the silicide pattern 60a are sequentially stacked, has been formed on the memory area M, whereas the salicided NMOS and PMOS gate electrodes $G_N$ and $G_P$ and the salicided source/drain regions 340 and 350 have been formed on the logic area L. The polycide gate electrode $G_{PS}$ is lower than the NMOS and PMOS gate electrodes $G_N$ and $G_P$.

The nitride spacer 320 is provided along the sidewall of the polycide gate electrode $G_{PS}$ and the NMOS and PMOS gate electrodes $G_N$ and $G_P$. The GPOX 270 and the MTO layer 310 or the HTO layer may be sequentially interposed between the sidewall of the polycide gate electrode $G_{PS}$ and the nitride spacer 320. The interlayer dielectric 390 overlaying the polycide gate electrode $G_{PS}$ and the NMOS and PMOS gate electrodes $G_N$ and $G_P$ is formed over the entire surface of the semiconductor substrate S. Furthermore, the SAC 400 formed by an SAC process penetrates the interlayer dielectric 390 on the source/drain region 330 on the memory area M. The MTO layer 310 or the HTO layer, and the SBL are sequentially interposed between the interlayer dielectric 390 and the hard mask pattern 250 formed on the polycide gate electrode $G_{PS}$.

The silicide pattern 60a included in the polycide gate electrode $G_{PS}$ and the silicide pattern 380 overlying the top surface of the NMOS and PMOS gate electrodes $G_N$ and $G_P$ may be comprised of different kinds of silicide materials.

Although the invention has been described with reference to preferred embodiments thereof, those skilled in the art will recognize that various modifications may be made to the present invention without departing from the spirit and scope thereof, wherein the following features and advantages are provided.

According to one feature of the present invention, a polycide gate electrode and NMOS and PMOS gate electrodes are patterned simultaneously by a single etching process. Thus, this may avoid the complexity of a process caused by a separate patterning of the gate electrodes on a memory area and on a logic area.

According to another feature of the present invention, after performing a high temperature heat treatment process such as GPOX, p-type conductive impurities are implanted into a PMOS gate electrode. Thus, this prevents thermal diffusion of p-type impurities such as B ions passing through a gate oxide layer into a PMOS channel region.

According to still another feature of the present invention, the manufacture of an MML semiconductor device through organic combination of SAC, SALICIDE, and dual gate processes makes possible memory circuits of high integration density and logic circuits of high performance.

According to yet still another feature of the invention, since the polycide gate electrode formed on the memory area is lower than the NMOS and PMOS gate electrodes formed on the logic area, the aspect ratio of a contact hole formed by an SAC process can be reduced. Thus, this allows a further increase in integration density of memory circuits integrated on the memory area.

What is claimed is:

1. A method of manufacturing a memory merged logic (MML) semiconductor device, the method comprising the steps of:
   (a) preparing a semiconductor substrate on which a memory area and a logic area are defined, and on which an isolation layer and a gate oxide layer formed on an active region defined by the isolation layer have been formed;
   (b) forming a gate conductive layer comprised of silicon on the memory area and the logic area;
   (c) lowering a height of the gate conductive layer formed on the memory area and implanting a predetermined conductive type of impurities into the lowered gate conductive layer; and
   (d) forming a suicide layer only on the lowered gate conductive layer on the memory area using deposition and photolithography, wherein the top surface of the silicide layer is lower than the top surface of the gate conductive layer formed on the logic area.

2. The method of claim 1, wherein step (c) further comprises the steps of:
   (c1) forming a photoresist pattern on the logic area;
   (c2) etching the gate conductive layer formed on the memory are by an etching process that uses the photoresist pattern as an etch mask and making the gate conductive layer on the memory area lower than the gate conductive layer on the logic area; and
   (c3) performing an ion implantation process to implant a predetermined conductive type of impurities into the lowered gate conductive layer on the memory area.

3. The method of claim 1, wherein step (d) further comprises the steps of:
   (d1) forming a suicide layer on the memory area and the logic area, wherein the top surface of the suicide layer formed on the memory area is lower than the top surface of the gate conductive layer formed on the logic area;

(d2) forming photoresist pattern on the suicide layer formed on the memory area;

(d3) removing the suicide layer formed on the logic area using the photoresist pattern as an etch mask; and (d4) removing the photoresist pattern.

4. The method of claim 1, further comprising, after step (d), the steps of:

(e1) forming hard mask patterns comprised of nitride on portions in which the gate electrodes will be formed on the memory area and the logic area;

(f1) forming the polycide gate electrode doped with predetermined impurities and the NMOS and PMOS gate electrodes doped with no impurities on the memory area and the logic area, respectively;

(g1) implementing lightly doped drain (LDD) structures having a conductive type of impurities required in the memory and logic areas by an ion implantation process;

(h1) sequentially forming a nitride layer and an oxide layer over the entire surface of the semiconductor substrate in which the LDD structures have been implemented;

(i1) selectively removing the oxide layer formed only on the logic area; and (j1) removing a nitride layer formed on the logic area and a hard mask pattern formed on the NMOS and PMOS gale electrodes by a wet etching process.

5. The method of claim 4, wherein, in step (f1), the gate oxide layer is used as an etch stop layer.

6. The method of claim 4, wherein the oxide layer formed in step (h1) is a medium temperature oxide layer.

7. The method of claim 4, further comprising, after step (j1), the steps of:

(k1) forming a spacer comprised of nitride along the sidewall of the polycide gate electrode and the NMOS and PMOS gate electrodes;

(l1) implanting a predetermined conductive type of impurities into the memory area and the logic area to form source/drain regions, while implanting a predetermined conductive type of impurities into the NMOS and PMOS gate electrodes;

(m1) exposing the top surface of the NMOS and PMOS gate electrodes and the source/drain region formed on the logic area by a wet etching process;

(n1) forming a suicide pattern, which is sell aligned on the top surface of the NMOS and PMOS gate electrodes and the source/drain region on the logic area, by a self-aligned silicide (SALICIDE) process;

(o1) forming an interlayer dielectric over the entire surface of the semiconductor substrate; and (p1) forming a self-aligned contact (SAC) electrically connected with the source/drain region formed on the memory area by a SAC process.

8. The method of claim 7, further comprising, prior to step (m1), the step of selectively forming a silicide blocking layer, in which a medium temperature oxide layer and a nitride layer are sequentially stacked, only on the memory area.

9. The method of claim 1, further comprising, after step (d), the steps of:

(e2) forming a hard mask pattern comprising a nitride and a photoresist pattern on portions in which the gate electrodes will be formed on the memory area and the logic area, respectively; and (f2) forming a polycide gate electrode doped with predetermined impurities and NMOS and PMOS gate electrodes doped with no impurities on the memory are and logic area, respectively, by an etching process that uses the hard mask pattern and the photoresist pattern as an etch mask.

10. The method of claim 9, wherein, in step (f2), the gate oxide layer is used as an etch stop layer.

11. The method of claim 9, further comprising, after step (f2), the steps of:

(g2) removing the photoresist pattern;

(h2) implementing LDD structures having a conductive type required in the memory area and the logic area by an ion implantation process;

(i2) forming a spacer comprising nitride on the sidewall of the polycide gate electrode and the NMOS and PMOS gate electrodes;

(j2) forming source/drain regions on the memory area and the logic area by an ion implantation process;

(k2) selectively forming a suicide blocking layer, in which a medium temperature oxide layer and a nitride layer are sequentially stacked, only on the memory area;

(l2) exposing the top surface of the NMOS and PMOS gate electrodes and the source/drain regions of the NMOS and PMOS by a wet etching process, while protecting the memory area by the silicide blocking layer;

(m2) performing a SALICIDE process to form a silicide pattern on the top surface of the NMOS and PMOS gate electrodes and the source/drain regions of the NMOS and PMOS;

(n2) forming an interlayer dielectric over the entire surface of the semiconductor substrate; and (o2) forming a SAC electrically connected with the source/drain region formed on the memory area by a SAC process.

* * * * *